United States Patent

Harrison

[15] 3,661,635

[45] May 9, 1972

[54] DUAL-ETCHED REFRACTORY METALLIZING

[72] Inventor: Henry F. Harrison, Chattanooga, Tenn.

[73] Assignee: American Lava Corporation, Chattanooga, Tenn.

[22] Filed: Feb. 20, 1970

[21] Appl. No.: 13,025

[52] U.S. Cl. .................................117/212, 96/36.2, 117/8.5

[51] Int. Cl. .........................................................H05k 3/04

[58] Field of Search ................117/212, 8.5; 252/512; 96/36, 96/36.2, 36.4

[56] References Cited

UNITED STATES PATENTS

| | | | |
|---|---|---|---|
| 2,993,815 | 7/1961 | Treptow | 117/212 |
| 3,303,399 | 2/1967 | Hoogendoorn et al. | 117/200 X |
| 3,240,624 | 3/1966 | Beck | 117/8.5 X |
| 3,542,551 | 11/1970 | Rice | 96/38.4 X |
| 3,474,718 | 10/1969 | Guthrie et al. | 117/212 X |
| 3,290,171 | 12/1966 | Zollman et al. | 252/512 X |

*Primary Examiner*—Ralph S. Kendall
*Attorney*—Kinney, Alexander, Sell, Steldt & Delahunt

[57] ABSTRACT

A process for metallizing on ceramic substrates with fine detail patterns of refractory metal which includes a prefiring to effect oxidation of a portion of the metallizing coating, application of a photopolymerizable coating thereover followed by exposure in pattern form using a mask, removal of unpolymerized coating by conventional means, acid etching to remove the oxides formed during pre-firing in exposed portions of the metallizing coating and mechanical removal of unoxidized and unsintered metal remaining in etched portions. This is followed by a final firing which destroys the photoresist and sinters the metal remaining on the substrate.

5 Claims, 7 Drawing Figures

INVENTOR.
HENRY F. HARRISON
BY Kinney, Alexander,
Sell, Steldt & DeLaHunt
ATTORNEYS

DUAL-ETCHED REFRACTORY METALLIZING

This invention relates to metallizing ceramic substrates with refractory metals and particularly to a process for obtaining fine detailed pattern structure in such metallizing. More particularly this invention relates to a process involving partial firing and preoxidation of an overall metallizing coat, application of a photopolymerizable composition in a thin layer and pattern wise exposure thereof, removal of unexposed portions of the thin layer to give a patterned protective coating and dissolving, by means of dilute acid, of the oxides present in the unprotected pre-fired coating followed by mechanical removal of the unreacted metal. The residual metal is then heated under reducing conditions to volatilize photopolymer residues, to reduce remaining oxides and to sinter the metal.

The production of circuitry on ceramic substrates demands greater and greater refinement and accuracy of rendition of the master drawings. Heretofore, it has been customary to produce refractory metal circuits by means of screen printing and other procedures which have limits as to the fineness of lines (resolution) and the distances apart which are feasible. Screen printing methods, for example, resolve patterns of metal having minimum widths of 4 mils (0.1 mm.) on 8 mil (0.2 mm.) centers with tolerances of about ± 1 mil (0.025 mm.) width if optimum conditions are fulfilled. This is not regularly possible by large scale production methods. Thicknesses of such layers are generally in the range of 0.01 mm. (0.4 mil) to 0.1 mm. (4.0 mils) or even somewhat thicker up to about 0.3 mm. (11 mils).

An alternative method which has been used heretofore is by photoetching techniques. Thus, the entire surface is metallized and sintered and a pattern is generated thereon using photolithographic technique and gold plating. Thicknesses are about as above. The gold pattern acts as an acid resistant mask during etching operations of the film of refractory metal. Etching requires strong reagents and relatively long times. There is a considerable tendency for undercutting of the gold plated mask during etching so that the edges of the patterns are seriously undercut and patterns have a rather uneven outline. This, of course, limits the minimum feasible width of fine lines. About the smallest patterns that can be obtained are 2 mil (0.05 mm.) lines on 4 mil (0.1 mm.) centers with ± 0.2 mil (0.005 mm.) tolerance on line width. Such resolution is not obtainable on all attempts and some failures occur.

When a metallizing material is used which includes glassy matter or is itself reactive, the gold masking procedure is disadvantageous in that there may be occlusion of metal particles by sintered glass. The metal cannot be attacked by the etchant and remains on the surface. Parts of the surface which should be free from pattern are then contaminated by a residual film. If etchants are used which are strong enough to attack this film they may also seriously interfere with the bond of the metal pattern to the substrate.

It is an object of this invention to provide a method for the production of metallized patterns of high resolution and fine structure on ceramic substrates. Another object of this invention is to provide ceramic substrates having high resolution refractory metal patterns. Other objects will become apparent from the disclosure hereinafter.

In accordance with these and other objects of the invention a superior method for the application to fired ceramic substrates of metallizing patterns having great resolution and fineness of structure, that is, more and narrower lines per given distance than heretofore possible, has been found. This method involves certain new processes and a special sequence of operation.

The sequence of operations requires first the application of a layer of metallizing material on a fired ceramic substrate as heretofore except that it is not sintered but is heated in air only sufficiently to effect slight oxidation rather than being fully fired in a non-oxidizing atmosphere. For this purpose tungsten or molybdenum-manganese metallizing compositions are especially appropriate. The selected composition, many of which are commercially available, is applied together with any necessary binder in a uniform layer over the substrate by knife coating, screening, printing, spraying or by transfer, dried and heated at about 500° C. for 10 to 15 minutes in an oxidizing atmosphere which burns off the binder and at the same time forms small amounts of the oxides of the tungsten, molybdenum or manganese. Layers are usually about 0.01 to 0.1 mm. (0.4 to 4 mils) thick but may be more or less. The oxides serve to bond the metal particles to one another and also to the substrate. The incidental volatilization of the organic binder is advantageous because it destroys sensitivity to organic solvents which may be present in the photoresist applied in the next step. Bonding of the metal particles by the oxide formed in this first step is adequate so that the coated substrate can be handled with no difficulties and the partially oxidized layer is adherent and resistant to flaking.

To the coated substrate is then applied, over the partially oxidizal metallizing layer, a layer of a photopolymerizable photoresist, for example, of one of the commercial types. These are essentially organic compounds or mixtures thereof which are polymerized by exposure to light. Many such are available in the art. They are applied as recommended in layers less than 1 mm. thick. Exemplary compositions are PhotoResist, a product of Eastman Kodak Company, AZ-300 a product of Shipley Company, Inc., or Riston a product E. I. Dupont de Nemours and Company. The photopolymerizable layer, which need be only 0.01 to 0.1 mm. thick but may be thicker or thinner, is dried and then exposed through a suitable mask. The usual method is with ultraviolet light for a prolonged period. Exposed portions produce a resistant polymerized pattern on the surface. Unexposed and hence soluble portions of the composition are removed by standard procedures such as washing with solvents leaving a pattern of the polymer in the form of the desired grid of circuit elements, conductors, etc. as determined by the mask.

At this point in the process the substrate has a complete metallic layer which is partially oxidized and a photopolymerized masking pattern thereon. The substrate is now treated with a dilute acid to dissolve oxide from the unprotected portions of the metallic layer. A suitable procedure is treatment for 2 minutes in a 25 percent solution of hydrochloric acid at about 23° C. Concentration may be varied from 10 to 100 percent and times from 1 to 10 minutes. The criterion is that the unprotected metallizing layer will become friable under relatively mild mechanical attack and will be removed completely where exposed to the acid treatment. It will be recognized that other acids, both inorganic and organic, and under some conditions even hot water, may be employed. The choice of solution depends at least partly on the metal and oxide but in general hydrochloric acid at 25 percent of concentrated strength is suitable and convenient with these refractory metals.

Under the controlled conditions of operation of the invention there is virtually no tendency for undercutting of the masking pattern. The time for etching is short and mechanical abrasion does not tend to undercut. As a result, the protected masked oxidized metallizing layer is separated from the exposed portions from which oxide is dissolved by virtually perpendicular sides. The metal which remains in the leached or acid treated portions is dislodged and removed by any of several essentially mechanical processes, for example, by brushing, by a mild forceful spray of water, dilute acid or other liquid, or by ultrasonic cleaning.

After thorough removal of the undesired leached metallic portions the substrate is dried and subjected to its final firing. This is carried out at temperature high enough so that the refractory metal is sintered, about 1,500° C. for tungsten, 1,450° C. for molybdenum-manganese. As the temperature is raised during the firing operation the residue of masking polymer remaining on the pattern is destroyed by volatilization and/or oxidation. Because the tungsten or molybdenum-manganese metallizing layers are subject to oxidization it is necessary that this final firing be carried out under reducing atmosphere. The reducing atmosphere also tends to reduce the residual amounts of oxide present in the metallizing layer which has served as a bond up to this time. The resultant pattern therefore contains sintered metals and any glassy bonding phase. Lines in patterns made by this process may be as thin as 0.025 mm. (1 mil) or finer and they may be as close as 0.05 mm. (2 mils) on centers. Tolerances are retained to about 0.0025 mm. on0.025 mm. lines. Lines of 0.025 mm., 0.05 mm. on centers as obtained are superior to any obtained by the prior art processes. They are about one-quarter the width of lines obtainable by screen printing and are closer together.

The process is now described by particular reference to the accompanying drawings wherein FIGS. 1 through 7 represent digramatically cross-sections through portions of a ceramic substrate as it goes through the several steps of the process of the invention.

FIG. 1 shows a ceramic substrate 10 suitably of alumina on which has been applied a metallizing layer which has then been prefired to give an oxidized cementing phase 12 and metallic phase 14. Metallic phase 14 is preferably tungsten or molybdenum-manganese. The combined phases provide oxidized metallic layer 16. In order that the two phases 12 and 14 can be identified by cross-hatching lines, the metal 14 is represented as being large rounded particles whereas the actual shape and size is immaterial and it is more probably much smaller particles as shown at 18 but where it is not feasible to show the oxidized phase. It will be understood that layer 16 is contemplated as being composed of metallic particles cemented together and to the substrate by an oxidized phase.

In FIG. 2 a photopolymerizable layer 20 is applied. It is shown as liquid because until it is polymerized it is actually a very viscous liquid. It adheres well to layer 16.

FIG. 3 shows the exposure of layer 20 to actinic light from source 30 through transparent portions 32 and non-exposure where masked by opaque portions 34 of the masking screen 36 having a masking pattern thereon. It will be seen that exposed portions at 22 are polymerized and unexposed portions at 24 remain unpolymerized.

FIG. 4 shows the removal of unexposed portions of layer 20 leaving only exposed portions 22.

FIG. 5 shows the result of treatment with solution, e.g., dilute acid, for dissolving the oxide cement 12 from layer 16 where there is no protective layer 22. It will be seen that only metallic particles 14 remain in portions subject to this etching.

Figure 1:
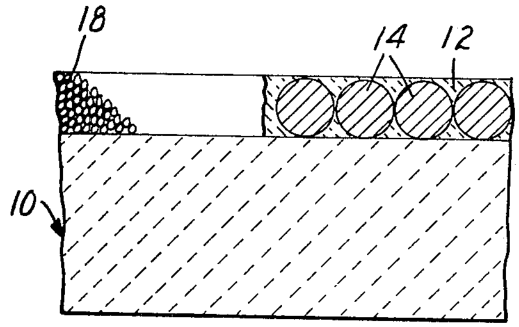
Figure 2:
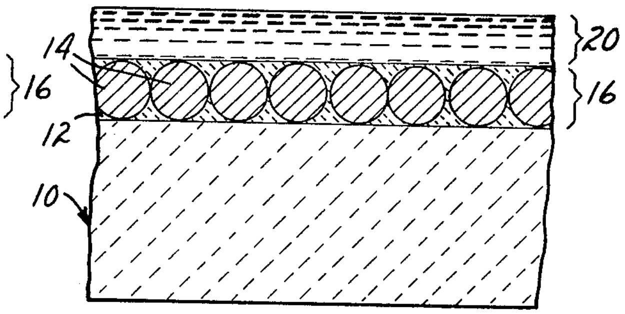
Figure 3:
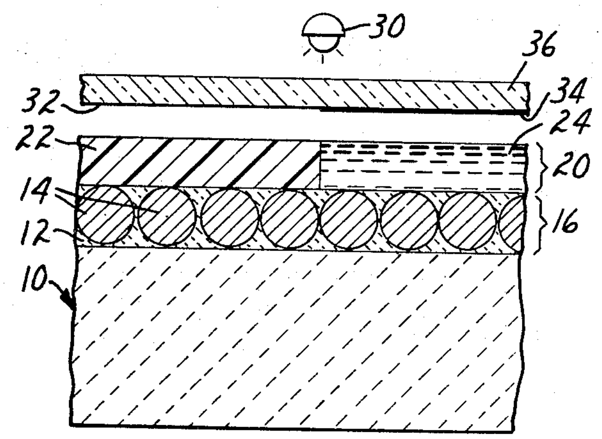
Figure 4:
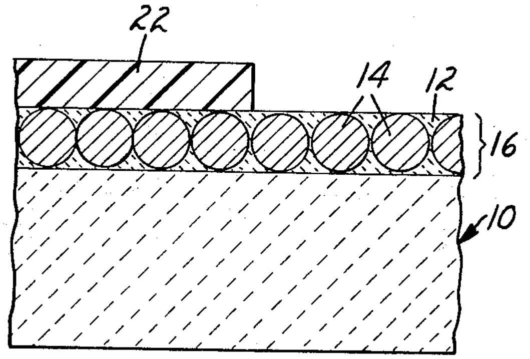
Figure 5:
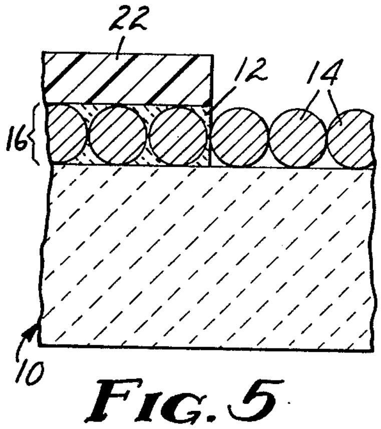
Figure 6:
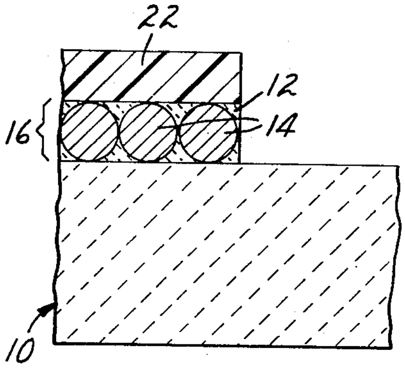
FIG. 6 shows the cross-sectional view of the previous figures after being subjected to an abrasive action which removes the metallic particles of layer 16 where the oxide was etched away.
Figure 7:
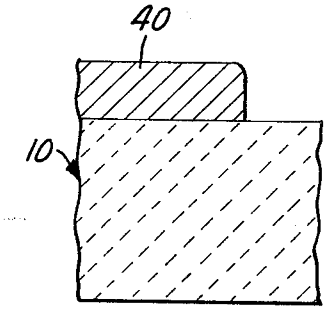
FIG. 7 shows the result of firing the structure of FIG. 6 to a temperature high enough to volatilize the masking pattern 22 and reduce oxides and sinter the metallic particles into metallic pattern 40.

What is claimed is:

1. In a process for the production of a refractory metal circuit pattern on a fired ceramic substrate the steps of prefiring a layer of tungsten or molybdenum manganese metallizing paste on said fired ceramic substrate to a partially oxidized condition at about 500° C. for about 10 to 15 minutes in an oxidizing atmosphere, masking the partially oxidized layer in a desired pattern by applying and patternwise polymerizing polymerizable photoresist in a layer less than 1 mm. thick on said partially oxidized layer followed by washing away unpolymerized portion of said photoresist and removing unmasked portions thereof by successive leaching of oxide with dilute acid and mechanical abrasion and cleaning to dislodge residual exposed metallizing composition.

2. A process for the production of a sintered refractory metal pattern on a refractory substrate comprising the steps of:

A. applying a uniform layer of metallizing paste comprising tungsten or molybdenum manganese in suitable vehicle to a fired ceramic substrate and prefiring said layer of metallizing paste to a temperature of about 500° C. in an oxidizing atmosphere for about 10 to 15 minutes,
B. applying a thin coating less than 1 mm. thick of photopolymerizable composition to said prefired refractory metal layer,
C. patternwise exposing said coating of photopolymerizable composition to actinic light to generate a polymerized masking pattern,
D. removing unpolymerized parts of said photopolymerizable layer to expose unmasked partially oxidized metallized layer,
E. solubilizing oxides in the unmasked metallized layer,
F. removing the unmasked metallized layer after solubilization of oxides by abrasion means and thorough cleaning and
G. firing the substrate with patterned layers in reducing atmosphere at a temperature sufficiently high to destroy and volatilize residual photopolymer mask and sinter the refractory metallic layer.

3. A process according to claim 2 wherein oxides in the unmasked metallized layer are solubilized by treating with aqueous acid for from about ½ to about 20 minutes at about 10° to 35° C.

4. A process according to claim 2 where abrasion means are an application of mechanical force by brushing or spraying under pressure.

5. The combination of fully fired ceramic substrate, on at least a portion of said substrate a layer of tungsten or molybdenum manganese partially oxidized and freed from organic binder by heating at about 500° C. in an oxidizing atmosphere for about 10 to 15 minutes and a layer at least covering said refractory metal of photopolymerizable composition.

* * * * *